United States Patent [19]
Weber et al.

[11] Patent Number: 5,954,068
[45] Date of Patent: Sep. 21, 1999

[54] DEVICE AND METHOD FOR TREATING SUBSTRATES IN A FLUID CONTAINER

[75] Inventors: Martin Weber, Bad Dürheim, Germany; Marc Meuris, Keerbergen; Ingrid Cornelissen, Hamont-Achel, both of Belgium

[73] Assignees: Steag MicroTech GmbH, Pliezhausen, Germany; IMEC vzw, Leuven, Belgium

[21] Appl. No.: 08/862,890

[22] Filed: May 23, 1997

Related U.S. Application Data

[63] Continuation-in-part of application No. 08/761,718, Dec. 6, 1996, abandoned.

[51] Int. Cl.⁶ .................................................. B08B 3/02
[52] U.S. Cl. ...................... 134/25.4; 134/135; 134/145; 134/153; 211/41.17
[58] Field of Search .................................. 134/135, 182, 134/200, 76, 143, 145, 61, 62, 153, 149, 25.4, 25.1; 211/41.17, 41.18

[56] References Cited

U.S. PATENT DOCUMENTS

| | | | |
|---|---|---|---|
| 2,036,261 | 4/1936 | Dinley | 134/76 |
| 2,803,257 | 8/1957 | Cozzoli | 134/143 |
| 3,444,868 | 5/1969 | Hungerford et al. | 134/145 |
| 3,650,283 | 3/1972 | Lang | 134/143 |
| 4,176,751 | 12/1979 | Gillissie . | |
| 4,850,381 | 7/1989 | Moe et al. | 134/62 |
| 4,924,890 | 5/1990 | Giles et al. | 134/76 |
| 4,987,407 | 1/1991 | Lee . | |
| 5,156,174 | 10/1992 | Thompson et al. | 134/902 |
| 5,299,901 | 4/1994 | Takayama . | |
| 5,313,966 | 5/1994 | Sadamori . | |
| 5,421,883 | 6/1995 | Bowden | 134/61 |
| 5,443,540 | 8/1995 | Kamikawa . | |

FOREIGN PATENT DOCUMENTS

| | | | |
|---|---|---|---|
| 4413077 | 10/1995 | Germany . | |
| 19546990 | 7/1996 | Germany . | |
| 60-106135 | 6/1985 | Japan . | |
| 2188309 | 9/1987 | United Kingdom | 134/62 |
| 9502473 | 1/1995 | WIPO . | |

*Primary Examiner*—Frankie L. Stinson
*Attorney, Agent, or Firm*—Robert W. Becker & Associates

[57] ABSTRACT

A device for treatment of substrates in a fluid container includes a container containing a treatment fluid and a substrate transport device moveable into a position above the container. The substrate transport device has at least one substrate holding device for securing the substrates in a first position and releasing the substrates in a second position. A third position may be provided in which a first set of substrates is secured and a second set of substrates is released. The substrate holding device is preferably at least one rotatable securing rod.

31 Claims, 5 Drawing Sheets

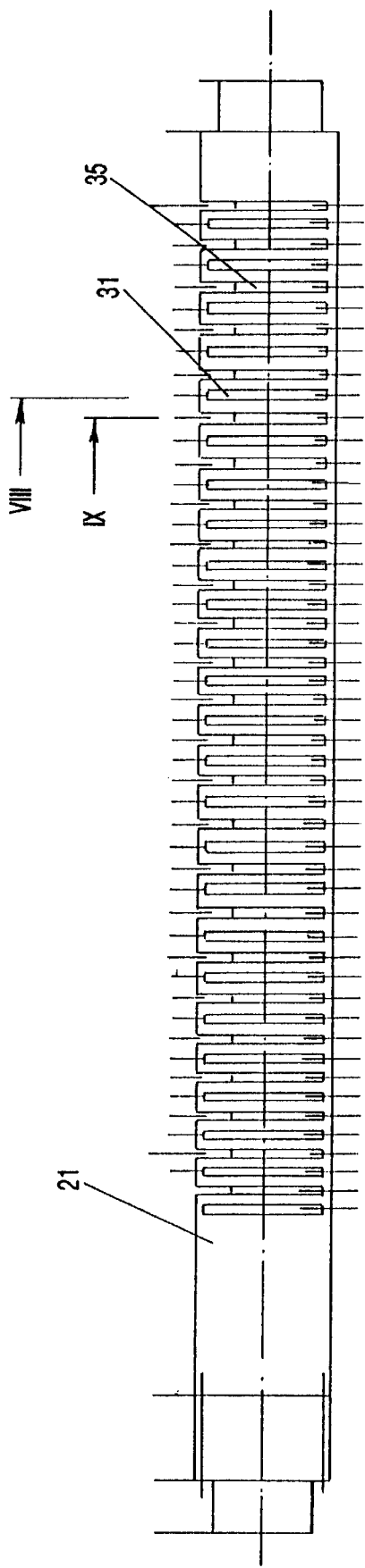
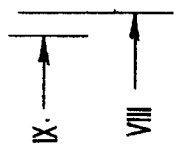
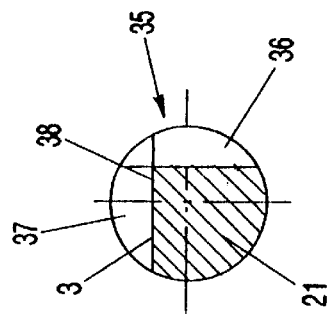
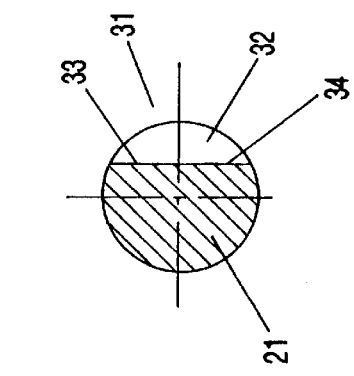

DEVICE AND METHOD FOR TREATING SUBSTRATES IN A FLUID CONTAINER

This application is a continuation-in-part of U.S. application Ser. No. 08/761,718 of Dec. 6, 1996, now abandoned.

BACKGROUND OF THE INVENTION

The invention relates to a device for treating substrates in a fluid container having a transport device that can be placed atop the fluid container, the transport device having at least one substrate holding device that secures the substrates in a first position and releases them in a second position. The invention also relates to a method for transporting substrates.

Such a device is known from German Patent Application 44 13 077 owned by the applicant. The hood in this device is provided to cover the top of the fluid container in which the substrates are treated during the treatment process and to introduce via the hood a fluid, for example, a gas mixture that, according to the Marangoni principle, improves drying of the wafers which are being moved out of the fluid bath.

To the top side of the fluid container a securing device is fixedly connected which, after removal of the wafers from the treatment fluid, secures the wafers in a position above the fluid level. For transporting the substrates in this position, for example, upon returning the wafer into a wafer support, the hood is pivoted open so that a gripping device can grip the substrates held by the holding device and can move it over to the substrate support. The loading of the treatment device with the gripping device is carried out in the reverse sequence. Subsequently, the hood is again pivoted so as to cover the substrates which have been placed by the gripping device onto the holding device.

Even though the known device can be operated with great success, it still has various disadvantages. Each movement with an additional gripping device requires time which negatively affects the productivity of the device. Also, each movement of the substrates from one holder to another in principle increases the risk of damaging the substrates. Furthermore, the position of the substrates in the holding device, after pivoting the hood into an open position or before closing it, is instable because the substrates are only held at their underside in slots of the holding device. Furthermore, each container requires such holding devices as well as drive units for displacing the holding devices so that the manufacturing costs and service expenditures are high.

SUMMARY OF THE INVENTION

It is therefore an object of the present invention to provide a device and suggest a method which require only minimal manufacturing and servicing expenditures, ensure safe treatment and manipulation of the substrates, simplify the treatment process of the substrates, and/or require a smaller container volume and thus less treatment fluid.

This object is inventively solved in that the substrate holding device comprises a rotatable securing rod. The securing rod does not require any space external to the substrate transport device, for example, no gripping arms, so that the space requirement for the inventive device is substantially reduced in comparison to conventional devices. This has the advantage that the container volume of the fluid container can be substantially smaller because space-requiring gripping arms etc. are not required. Furthermore, the actuating devices for the inventive securing rod, respectively, for rotation thereof are substantially simpler with respect to manufacturing as well as servicing expenditures, and the control and rotation process is substantially more reliably and substrate-friendly than the conventional gripping arms. The securing rod is advantageously movable by rotation from a first position in which the substrates are secured into a second position in which the substrates are released. Thus, a very simple switching from securing of the substrates into the release position and vice versa is possible, which contributes especially to the acceleration of the process sequence and thus to an increase of the productivity of the device.

The inventive device for treatment of substrates in a fluid container is primarily characterized by:

a container containing a treatment fluid;

a substrate transport device moveable into a position above the container;

the substrate transport device comprising at least one substrate holding device for securing the substrates in a first position and releasing the substrates in a second position;

the substrate holding device comprising at least one rotatable securing rod.

The at least one securing rod is rotatable from the first position into the second position.

The substrate transport device comprises at least two opposed walls with slots for receiving the substrates.

The at least one securing rod is arranged within one of the two opposed walls.

The substrates are combined in a substrate package and the at least one securing rod has a length matching a length of the substrate package.

The substrate transport device is preferably a hood and the at least two opposed walls are sidewalls of the hood.

The at least one securing rod comprises at least one projection that in the first position projects into the interior of the substrate transport device.

Preferably, the at least one securing rod in the second position is flush with an inner surface of the opposed wall to which the securing rod is connected.

The at least one securing rod comprises at least two different projections.

The at least one securing rod has a rectangular cross-section or a polygonal cross-section.

The at least one securing rod, in a longitudinal area on which the substrates rest in the first position, has slots for receiving the substrates.

The slots are positioned in the at least one projection an have different spacings.

The spacing between the slots matches a spacing between substrates combined for transport in a substrate package.

The spacing between the slots is half a spacing between substrates combined for transport in a substrate package.

The at least one securing rod has a third position in which a first set of the substrates is secured and a second set of the substrates is released.

Preferably, every other one of the substrates is secured and the substrates interposed therebetween are released.

The at least one securing rod seals the opposed wall to which the securing rod is connected to the exterior of the substrate transport device in at least one of the first, second, and third positions.

The hood is a preferably a processing hood. The substrate transport device (hood) comprises inlet openings for at least one fluid. In a special embodiment, the transport device may be designed for a drying process according to the Marangoni method.

The substrate transport device comprises a closing device at a side thereof facing the container.

The device may further comprise a loading/unloading station for loading the substrates onto and unloading the substrates from the substrate transport device.

The device may comprise a substrate support holder moveable into a position under the substrate transport device.

The substrates are combined for transport to substrate packages having an axis perpendicular to a face of the substrates. The substrate support holder has at least two displacement positions which are staggered relative to one another in a direction of the axis of the substrate package by half a spacing between the substrates.

The loading/unloading station comprises a substrate lifting device for lifting the substrates and lowering the substrates out of and into the substrate transport device.

The substrate lifting device has at least one stay matching a length of the substrate package in a direction of the axis.

The substrate lifting device has support surfaces having slots or notches spaced relative to one another by half a spacing of the substrates in the substrate package.

The substrate lifting device has support edges having slots or notches spaced relative to one another by half a spacing of the substrates in the substrate package.

The invention also relates to a method for transporting substrates by a substrate transport device moveable into a position above a container for treatment of the substrates, wherein the substrate transport device comprises at least one rotatable securing rod for securing the substrates in a first position and releasing the substrates in a second position. The method comprises the steps of:

a) rotating the securing rod into the second position;
b) inserting the substrates into the substrate transport device until at least the widest portion of the substrates is positioned above the securing rod;
c) rotating the securing rod into the first position.

The invention relates to another method for transporting substrates by a substrate transport device moveable into a position above a container for treatment of the substrates, wherein the substrate transport device comprises at least one rotatable securing rod for securing the substrates in a first position, releasing the substrates in a second position, and securing a first set of the substrates and releasing a second set of the substrates in a third position. The method comprises the steps of:

a) rotating the securing rod into the second position;
b) inserting a first set of substrates into the substrate transport device until at least the widest portion of the substrates is positioned above the securing rod;
c) rotating the securing rod into the third position in which the first set of substrates is secured;
d) inserting a second set of substrates into the substrate transport device spaced relative to the first set with a spacing of half a spacing between the substrates of the first set;
e) rotating the securing rod into the second position.

This method may further include the step of lifting the first and second sets after step d) and before step e) to such an extent that during step e) none of the substrates rests on the securing rod.

According to a further advantageous embodiment of the invention the transport device has two opposed walls with slots for the substrates. The slots serve as guides and securing means during the insertion of the substrates into the transport device, when the securing rod is in the position releasing the substrates, and/or secure the substrates when they are secured by the securing rod in the transport device.

The securing rod is arranged at least in one wall and extends preferably over the width of a substrate pack that is transported by or is to be transported by the transport device.

According to a further advantageous embodiment of the invention the transporting device is a hood. This results in the possibility to move the substrates without gripping arms into a substrate support or to remove them from a substrate support simply by placing the entire hood above the substrate support which is, for example, positioned adjacent to the fluid container. Since no additional moving step with an individual gripping device is necessary, the wafers can be moved much faster and the risk of wafer damage can be reduced. Due to the integration of the substrate transfer into the hood, it is also possible to provide only a single hood for a plurality of process stations, respectively, fluid containers because the same hood can be used for a plurality of process stations and can by itself transport the substrates. It is thus no longer required to provide each process station, respectively, each fluid container with a hood and/or individual substrate holders above the container in order to make the substrates accessible, as known from the prior art devices, for a gripping device. With the inventive device the treatment and manipulation of substrates is substantially simpler, more secure, and possible with a reduced manufacturing and service expenditure. Especially the size of the fluid containers and thus the amount of usually very expensive treatment fluid can be substantially reduced.

The securing rod comprises at least one area which in a first position, in which the substrates are secured thereat, projects into the interior of the transport device, respectively, hood. For disk-shaped substrates, for example, silicone wafers, the securing rod is positioned below a disk half when the disks are positioned within the hood. In the case of treating rectangular or square substrates, the substrate securing rod, when the substrates are contained within the transport device or hood, is positioned below the lateral edges of the substrates.

The inventive substrate holding device which is, for example, embodied as a securing rod, extends preferably over the entire width of the sidewall receiving the holding device. This is also true for the area or projection extending into the interior so that all of the adjacently arranged substrates in the first position, in which the substrates are secured, rest on the substrate holding device and are thus securely held within the transport device or hood.

According to a further very advantageous embodiment of the invention, the rotatable securing rod is embodied such that in the second position, in which the substrates are released, it is flush with the inner surface of the sidewall. The securing rod thus has preferably a planar surface that, with the inner surface of the sidewall of the transport device or hood, forms a unitary wall surface when the securing rod is in the position in which the substrates are released.

In the released state of the substrates they are preferably supported from below by a holder which is coordinated with the fluid container and is, for example, in the form of a knife-shaped strip. The substrates are moved into the fluid container by lowering the holder. In the case in which the hood is also loaded with a fluid, for example, a gas or a gas mixture, as is required in connection with drying of wafers according to the Marangoni principle, the hood must be sealed relative to the exterior. According to an especially advantageous embodiment of the invention, the securing rod is arranged within the sidewall of the hood such that at least in the second position, in which the substrates are released, the sidewall is sealed relative to the exterior. If this is not possible or possible only with great expenditure, an alternative embodiment is suggested in which the substrate holding device can be sealed off to the exterior with a housing.

According to another especially advantageous embodiment of the invention, the securing rod has a substantially rectangular cross-section. In the second position in which the substrates are released, a rectangular surface thus is flush with the inner surface of the sidewall.

According to a further very advantageous embodiment of the invention, the securing rod has a square, hexagonal, octagonal or, in general, a polygonal cross-section so that, depending on the respective requirements, the parts of the securing rod extending into the hood are provided in different shapes or designs for securing the substrates in the first position. Thus, it is possible that with the same securing rod differently shaped securing elements adapted to the respective substrates, substrate thickness and/or substrate spacing can be provided. By correspondingly rotating the securing rod, different stay projections for selectively securing the substrates are thus available. This is also possible with a securing rod of a round cross-section in which at least one circular segment of the cross-section has been removed.

According to a further very advantageous embodiment of the invention, the securing rod in the longitudinal areas at which the substrates in the first position are secured, is provided with slots for the substrates. Thus, a secure hold is provided for the substrates and the desired spacing between the substrates is ensured. It is advantageous to provide the aforementioned different stay projections, areas and/or polygonal surfaces of the securing rods with slots which have different spacings, different slot widths and/or different slot depths for substrates having different thickness or for substrates with different packing densities.

According to one embodiment of the invention the portions between the slots correspond to the spacing between the substrates of a substrate package. According to an especially advantageous embodiment of the invention the spacings between the slots are half the size of the spacings between the substrates of a substrate package, i.e., each second slot of the securing rod, respectively, the stay projection, or the area projecting into the interior of the transporting device and/or the polygonal surface of the securing rod, is thus occupied by a substrate upon insertion of a substrate package.

In general, it is also inventively possible to select the spacing between the slots as an integer portion of the spacing between the substrates of a substrate package so that, for example, only every third, fourth, or fifth slot is loaded with a substrate by the introduced substrate package.

According to an especially advantageous embodiment of the invention, the securing rod has a third position in which a first set of the substrates is secured and a second set is released. Preferably, every other substrate is secured and each intermediate substrate is released. In this manner it is possible in the third position of the securing rod, which can be reached upon rotation of the securing rod, to secure a first set of the substrates, for example, a substrate package that has already been introduced by the transport device, and to introduce a second set of substrates, for example a substrate package within the releasing portion of the securing rod where the slots for allowing passage of these substrates are located, in addition to and staggered to the first set of substrates, respectively, the first substrate package into the transporting device. As will be explained in detail in the following, subsequently, the securing rod is brought into the first position, respectively, rotated, in which then all substrates of the first as well as of the subsequently introduced second substrate package are secured. In this manner it is possible, to condense the substrate package in a simple manner and to combine two substrate packages with double substrate spacing to a substrate package with single substrate spacing, i.e., without gap.

Especially when the substrate transport device is a hood that can be arranged above the fluid container for processing of the substrate within the fluid container, it is advantageous when the securing rod seals in its first, second and/or third position the sidewall of the transport device, respectively, of the hood to the exterior.

According to another advantageous embodiment of the invention, the inventive hood serves at the same time as a processing hood which, for example, seals the fluid container during the treatment process relative to the exterior and the interior of which is used also for treating the substrates. It is very advantageous to provide the hood with inlet openings for supplying at least one fluid, for example, a gas or gas mixture. Such methods and devices are disclosed in parallel unpublished applications of the applicant, for example, German Application 195 46 990, German Application 196 15 108 and German Application 196 15 970.9 having the same filing date as the instant application. The disclosure of these applications is herewith enclosed by reference.

Advantageously, the hood comprises inlet openings or diffusors for the introduction of isopropyl alcohol or a gas mixture containing isopropyl alcohol when the hood is to be used for a drying process according to the Marangoni method.

According to a further advantageous embodiment of the invention the hood comprises a closing device at the side facing the fluid container. In this manner, it is possible to shield the substrates within the hood during transport from one treatment location to another relative to the exterior in order to prevent that during transport the substrates can be contaminated.

According to another advantageous embodiment of the invention, a substrate loading and/or unloading station for loading and/or unloading the transport device is provided. The loading and/or unloading station for the substrates is preferably arranged adjacent to the fluid container so that the transport device, preferably in the form of a hood, can be moved from the loading and/or unloading station to a position above the fluid container and vice versa.

Preferably, the substrate loading and/or unloading station comprises a substrate support holder that can be moved under the transport device so that a substrate support containing substrates can be placed under the transport device and the substrates can then be moved therefrom into the transport device, or an empty substrate support for receiving substrates from the transporting device can be placed into the receiving position during unloading.

According to an especially advantageous embodiment of the invention, the substrate support holder has at least two displacement positions which in the direction of the substrate package axes are staggered relative to one another by half a substrate distance. In this manner, it is possible to first bring a substrate package into the transporting device and to subsequently introduce a further substrate package, which is staggered relative to the first substrate package by half a substrate spacing, into the transport device. This can be done when the securing rod is in its third position, in which the first substrate package is secured and the second substrate package can be introduced also into the transporting device through corresponding through slots within the projecting area of the securing rods projecting into the transport device so that this provides a simple means and a simple method for condensing the substrates within the transporting device. In this manner it is possible to treat per package volume, for example, twice the number of substrates within a fluid container, even though the substrates in the substrate supports are arranged at double spacing relative to one another. This allows for a substantially increased productivity with respect to the amount of time and considerable savings with respect to the treatment fluid.

Advantageously, the loading and/or unloading station comprises a substrate lifting device for lifting and lowering the substrates into the transporting device, respectively, from the transporting device. Such a substrate lifting device has preferably at least one stay extending over the width of the substrate package which is provided, for receiving or securely holding the substrates in the longitudinal direction of the stay, respectively, the stays, with slots or notches. Such a substrate lifting device can, for example, be embodied in a same or similar manner to the lifting and lowering of substrates into and from a fluid container as disclosed in German patent application 44 13 077 or the aforementioned unpublished German patent applications of the instant applicant.

The object of the invention is solved by a method for transporting substrates with a device according to one of the preceding claims in that the loading process of the transporting device with the substrates includes the following method steps:

a) rotation of the securing rod into the second position in which the substrates are released, b) insertion of the substrates into the transport device until at least the widest portions of the substrates are positioned above the securing rod and c) rotation of the securing device into the first position in which the substrates are secured.

The unloading of the transporting device is performed in the reverse order in that the securing rod is rotated from the first position in which the substrates are secured into the second position in which the substrates are released and the substrates are then removed from the transport device. For insertion and removal of the substrates into the transporting device, respectively, from the transporting device a holding device in the form of a knife-shaped stay is preferably provided which can be lifted and lowered. Such a holding device as well as its drive device is, for example, known from German patent application 44 13 077 or the aforementioned unpublished German applications of the instant applicant so that in order to avoid repetition, reference is made thereto and these embodiments are therefore made part of the instant application.

According to an especially advantageous embodiment of the inventive method for condensing of substrates in the transporting device the following sequential method steps are suggested:

a) rotation of the securing rod into the second position in which the substrates are released, b) insertion of a first substrate package into the transporting device until at least the widest area of the substrates is positioned above the securing rod, c) rotation of the securing rod into the third position in which the inserted substrate package is secured by the securing rod, d) insertion of a second substrate package that in its position relative to the first substrate package is staggered by half a substrate spacing in the longitudinal direction of the securing rod, and e) rotation of the securing rod into the second position in which all substrates are secured.

In this manner it is possible to compact a substrate package which is positioned at regular spacing between the substrates in a substrate holder to a substrate package with double substrate density. With a substrate holder with, for example, 25 wafers it is thus possible, by combining two substrate packages with regular spacing, to produce one substrate package with double density of the substrates, i.e., with 50 substrates, in a simple manner, safely and reliably so that for the treatment of the half-spaced substrate packages relative to regular spaced substrate packages during treatment in the fluid container a substantially greater productivity and the use of a substantially reduced amount of fluid are possible.

The unloading of the transport device is performed in the reverse order so that the securing rod is rotated from the second position in which all substrates are secured into the third position in which every other substrate is released from the securing rod and can be unloaded, for example, by lowering the holding device. After unloading of the first substrate package, the securing rod is rotated from the third position into the second position in which the second substrate package, still held in the transporting device, is also released.

It is especially advantageous when at the end of the method step d) the first as well as the second substrate packages are lifted to such an extent that during the rotation of the securing rod according to method step e) into the second position, in which all substrates are secured, no substrate contacts the securing rod. In this manner upon rotation of the securing rod no wear at the substrate and/or the securing rod will occur so that the generation of particles is not possible.

With the invention it is also possible to produce a condensed substrate package that is comprised of more than two initial substrate packages.

DESCRIPTION OF PREFERRED EMBODIMENTS

Figure 2:
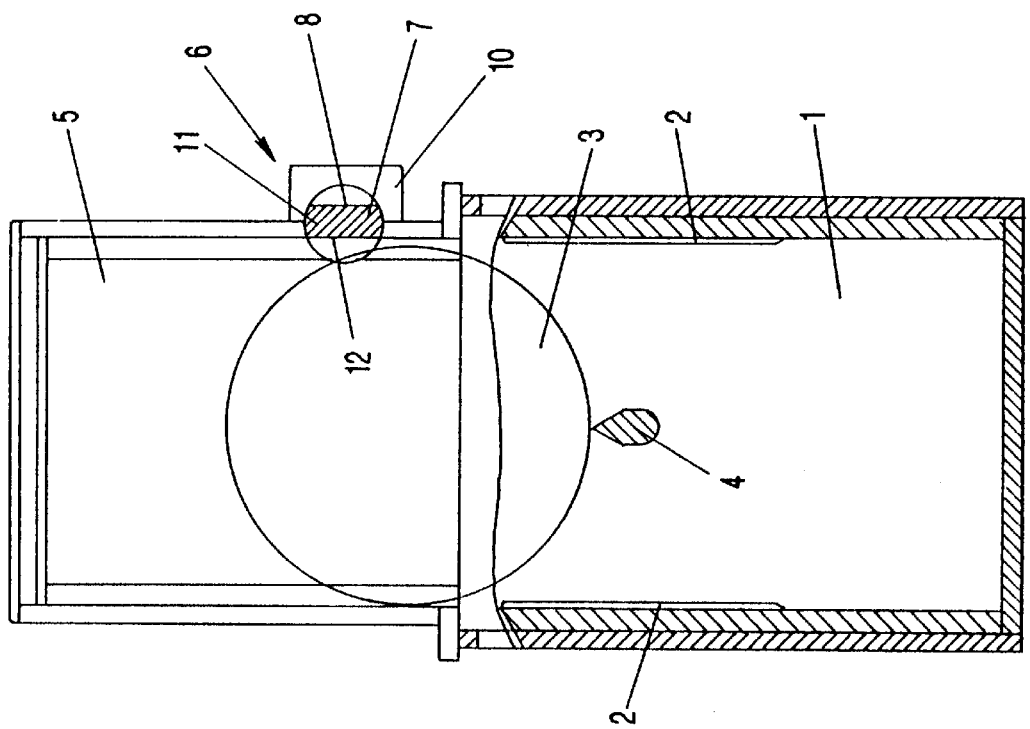
Figure 1:
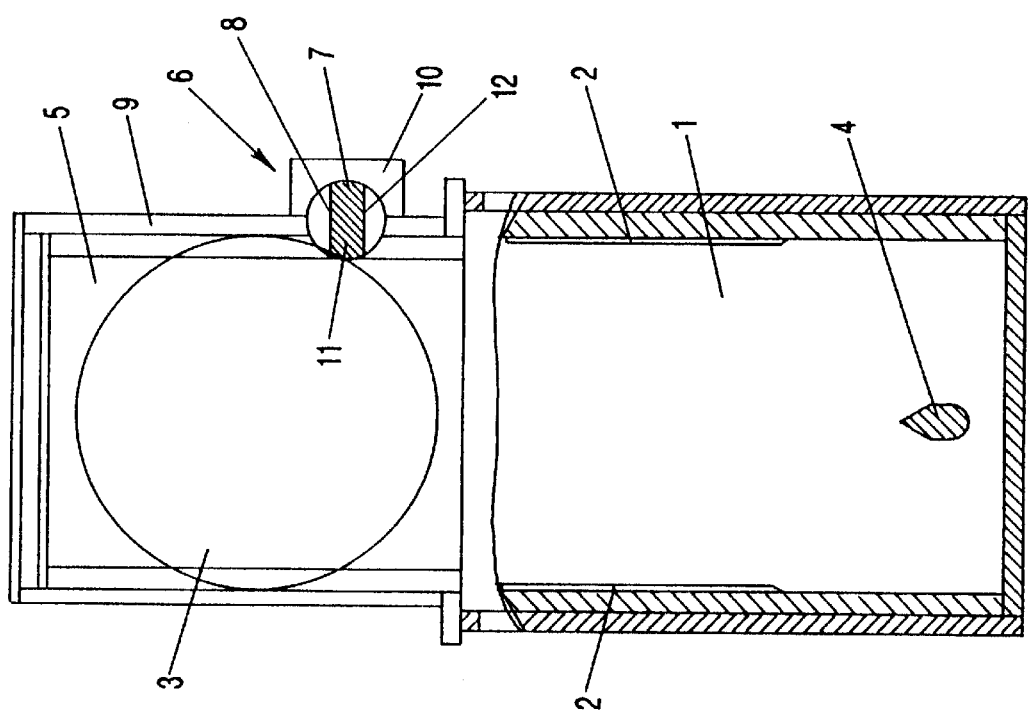
Figure 4:
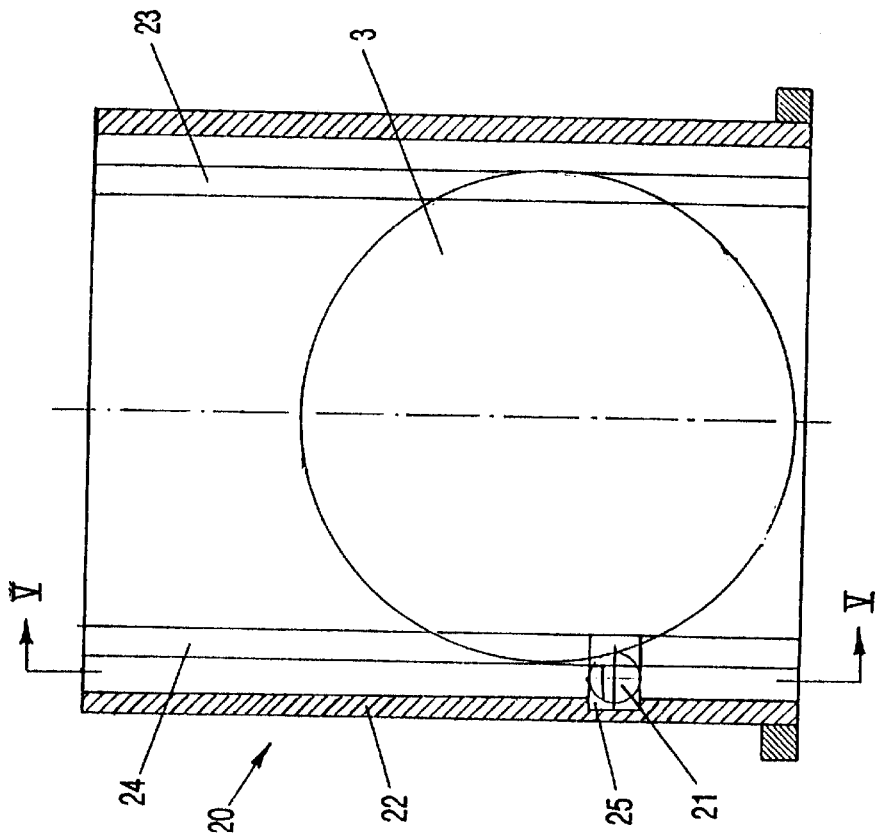
Figure 3:
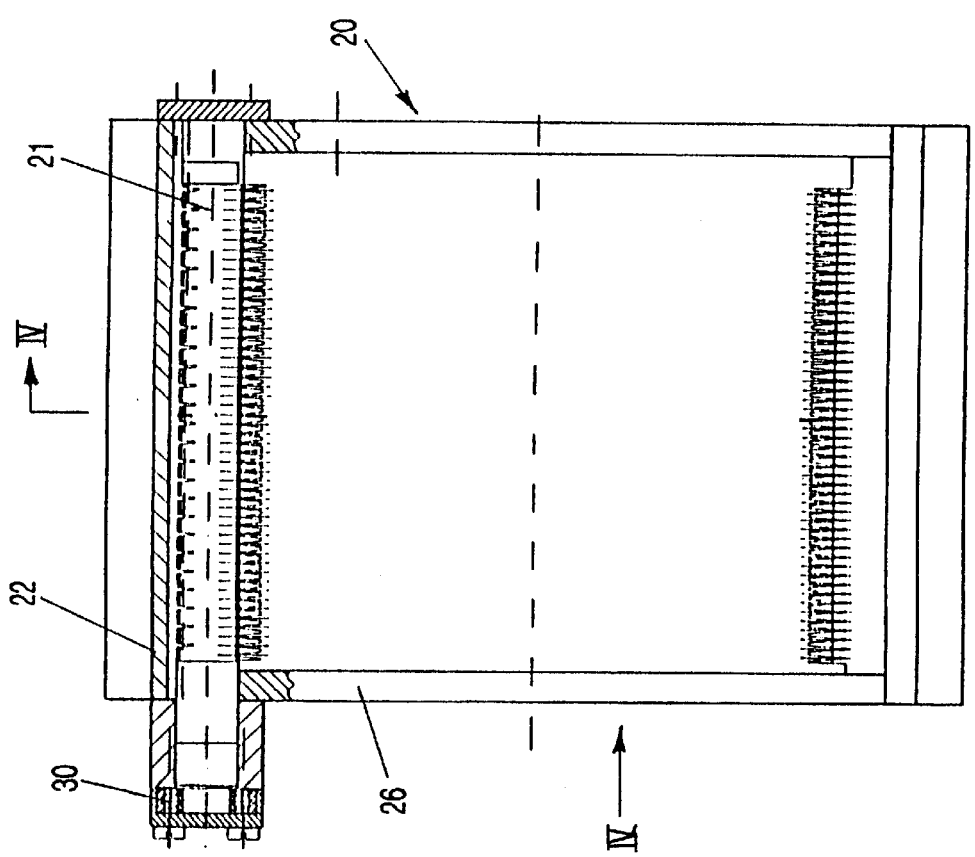
Figure 6:
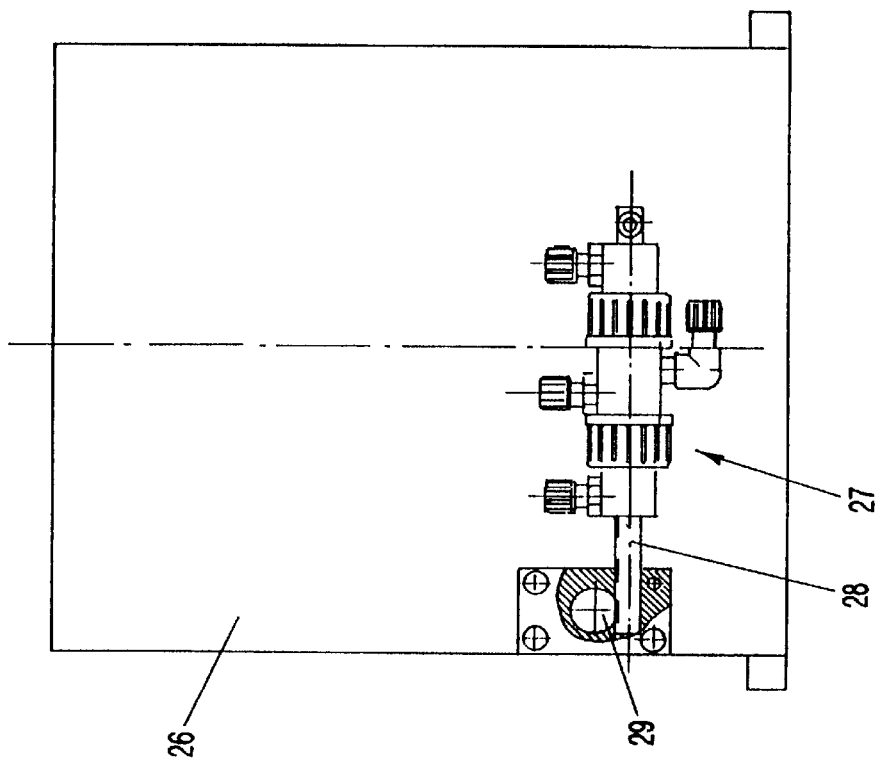
Figure 5:
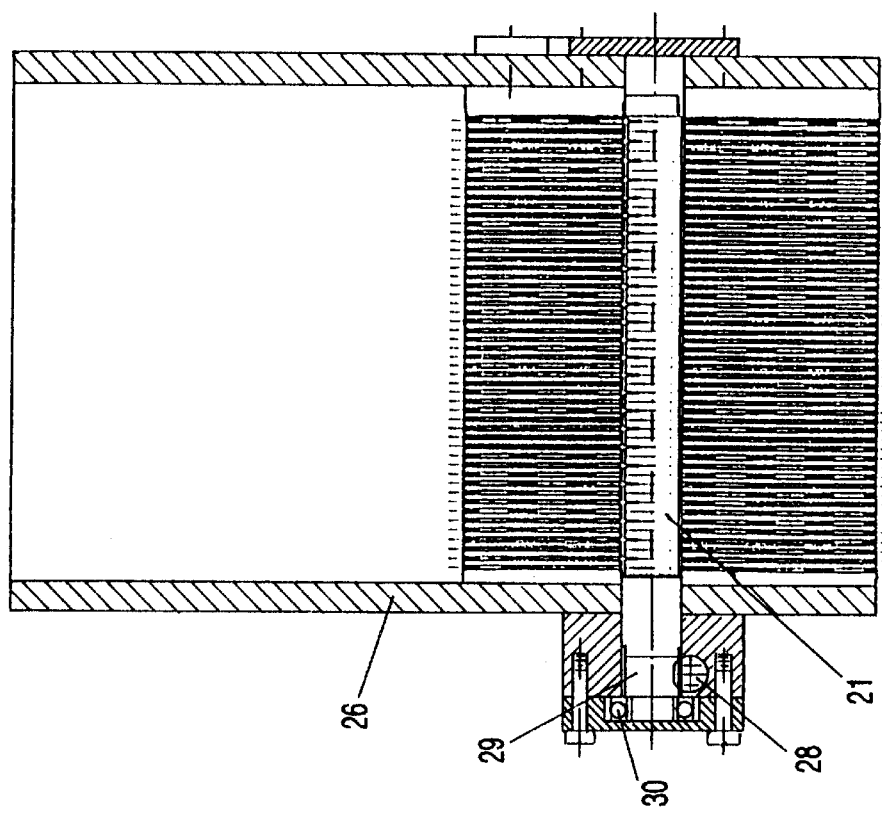
Figure 10:
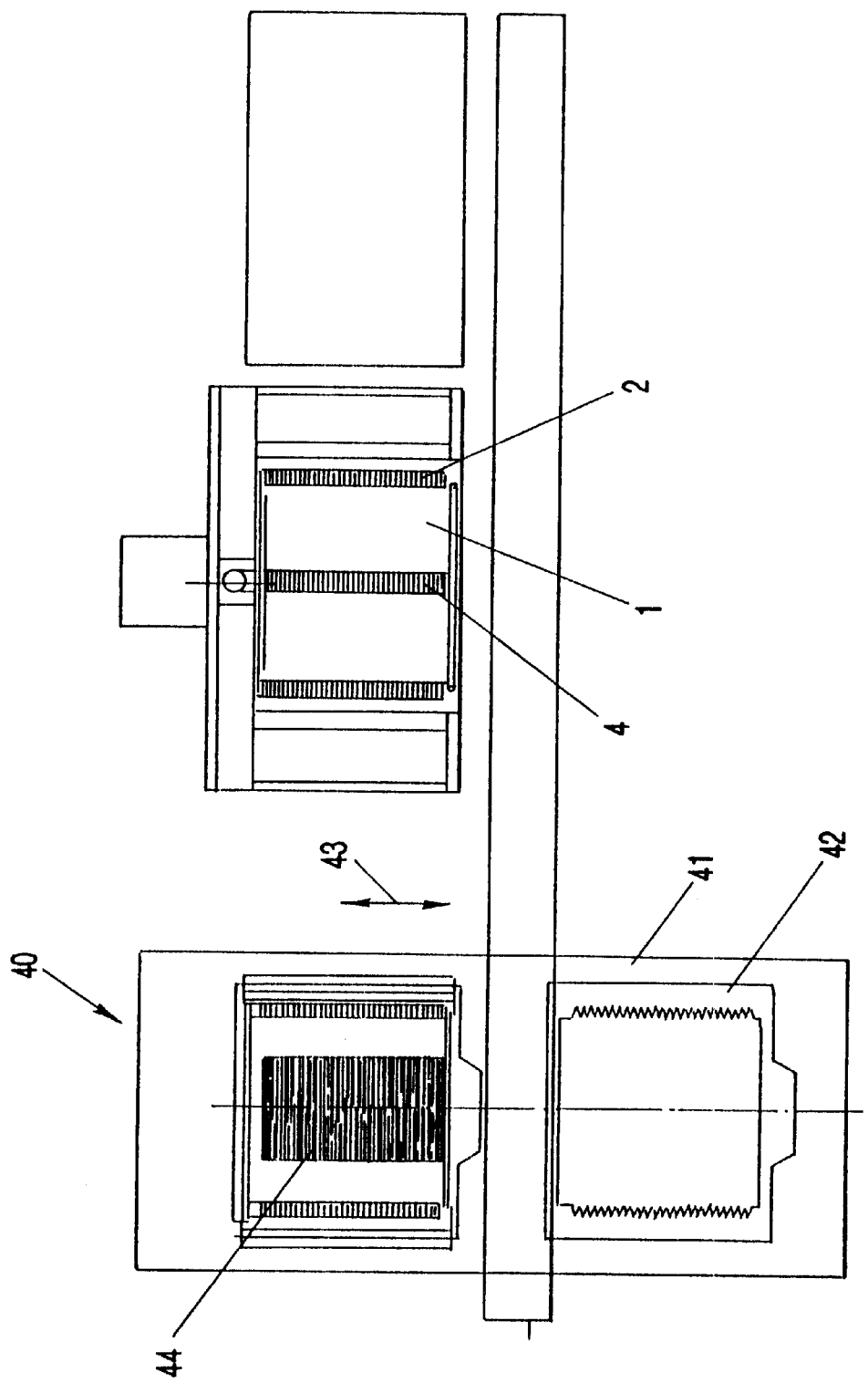

The invention will be explained in the following based on preferred embodiments in conjunction with the drawings. It is shown in:

FIG. 1 an embodiment of the inventive device with a substrate holding device in the form of a securing rod which is in a position for securing the substrates in a hood;

FIG. 2 the device of FIG. 1 in which the securing rod is in the second position for releasing the substrates;

FIG. 3 a further embodiment of the inventive device in a view from above onto the securing rod;

FIG. 4 a cross-sectional representation along the section line IV—IV of FIG. 3;

FIG. 5 a cross-sectional representation along the section line V—V of FIG. 4;

FIG. 6 a representation of the device according to FIGS. 3 through 5 viewed in the direction of VI with representation of the hydraulic drive device for the securing rod;

FIG. 7 an enlarged representation of the securing rod in a view from above onto the securing rod;

FIG. 8 a cross-sectional representation of the securing rod along the section line VIII—VIII shown in FIG. 7;

FIG. 9 a cross-sectional representation along the section line IX—IX shown in FIG. 7; and FIG. 10 a schematic representation of the inventive device with a substrate loading and/or unloading station for loading and/or unloading the transport device.

DESCRIPTION OF PREFERRED EMBODIMENTS

The embodiment according to FIGS. 1 and 2 comprises a fluid container 1 with securing slots 2 for the substrates 3 to be inserted as well as a securing device 4 in the form of a knife-shaped strip with which the substrates 3 are lowered into and lifted out of the fluid container 1 (compare FIG. 2).

Above the fluid container 2 a transport device in the form of a hood 5 is arranged which at one sidewall 9 is provided with a substrate holding device 6. In the represented embodiment of the substrate holding device 6 a securing rod 7 of a rectangular cross-section is provided which is rotatable about axis 8. The securing rod 7 is arranged at a sidewall 9 of the hood 5 and extends substantially over the entire width of the sidewall 9. A housing 10 closes off the area of the sidewall 9 where the substrate holding device 6 is located to the exterior.

In FIG. 1 the substrate holding device 6 is shown in a first position that secures the substrates 3. The securing rod 7 of a substantially rectangular cross-section is in a position in which one area, i.e., the stay projection 11, projects into the interior of the hood 5 and secures the substrates 3 within the hood 5.

FIG. 2 shows the substrate holding device 6 in the second position in which the wafers are released. The rotatable securing rod 7 has been rotated about the axis 8 relative to the position shown in FIG. 1 about 90° in a clockwise direction so that the stay projection 11 no longer extends into the interior of the hood 5. In the second position the long side 12 of the rod 7 of rectangular cross-section thus is flush with the inner surface of the sidewall 9 so that the wafers 3 can glide in the downward direction onto the securing device 4 with which they can be lowered into the fluid container 1.

As can be seen in FIG. 2, the cutout portions of the sidewall 9, relative to the exterior surface of the securing rod 7 oppositely arranged to the cutout surfaces of the sidewall 9, have a complementary shape and thus close off the opening in the sidewall 9 for the securing rod 7 to the exterior, especially when, as shown in FIG. 2, the securing device is in the second position for releasing the substrates.

The area of the securing rod 7 which, in the first position represented in FIG. 1, comes into contact with the wafers and secures them within the hood 5, are preferably provided with slots for securely holding and securing the wafers 3 at a defined distance to one another.

In the state represented in FIG. 1 the substrates 3 are securely held in position by the substrate holding device 8 and by the securing slots 15 within the hood 5 so that the entire hood 5 together with the substrates 3 can be transported to another location, for example, above a further fluid container or in a position above an empty substrate support without it being necessary to relocate the substrates with a gripping device. The same hood 5 can thus be used as a processing hood as well as a transport device. With a relative horizontal movement between the hood 5 and a substrate lifting device, respectively, a knife, the substrates 3 within the hood 5 are thus positioned above the substrate support and lowered onto it. The substrate holding device 6 is opened by rotation of the securing rod 7 and with a further relative movement of the substrates 3 between the hood 5 and the substrate support, respectively, the substrate knife, the substrates 3 are moved in a simple manner. In a corresponding manner the substrates are moved from the substrate support into the hood 5 whereby, after completion, the substrate holding device 6 has assumed the same position as represented in FIG. 1 in which the substrates 3 are secured.

It is possible to provide not only at one but at both sidewalls 9, 13 of the hood 5 a respective substrate holding device 6. It is also possible to embody the shown securing rod 7 of FIGS. 1 and 2 of the substrate holding device 6 with a different cross-sectional shape. Instead of rotatable rods it is also possible to provide for the substrate holding device 6 at least one flap which can be pivoted as desired from the sidewall 9 of the hood 5 into the interior.

FIGS. 3 to 6 show representations and cross-sections of a further embodiment of the inventive device with a transporting device in the form of a hood 20. As can be seen especially from FIG. 4, the securing rod 21, which has an embodiment different from the one shown in FIGS. 1 and 2, is positioned within the sidewall 22 to which the securing rod 21 is attached so that sealing problems at this location do not occur. The substrates 3 are supported on band-shaped elements 23, 24 provided with slots whereby in the element 24 a recess 25 for the securing rod 21 is provided.

As can be seen especially in FIGS. 3 and 5 and especially also in FIG. 6, at the exterior side of the wall 26 of the hood 20 a drive device 27 is provided which in the shown embodiment is hydraulically actuated, comprises a double cylinder, and has three switching positions which in the following will be explained with the aid of FIGS. 7, 8 and 9. A drive rod 28 which can be reciprocated to the right and to the left by a hydraulic drive unit 27, is embodied as a toothed rack and rotates a shaft 29 of the securing rod 21.

The drive device for rotating the securing rod 21 can have different embodiments, for example, it can be realized with a linear motor, whereby the drive unit 27 including a double cylinder is especially simple and reliable because the three switching positions can be easily reached without further control or travel sensing in a simple and reliable manner and because in devices of this kind hydraulic devices are already present.

For sealing the interior of the hood 20 to the exterior, the end portions of the shaft 29 are provided with sealing elements, for example, sealing rings 30.

In FIG. 7 the securing rod 21 of the embodiment according to FIGS. 3 through 6 is shown in an enlarged representation whereby the sidewall 22, at which or in which the securing rod 21 is arranged, in FIG. 7 is at the lower longitudinal side and the securing rod 21 is shown in a view from above, i.e., parallel to the substrate plane. The upper longitudinal side of the securing rod 21 in FIG. 7 faces the interior of the transporting device, respectively, of the hood 20.

In the embodiment of a securing rod 21 represented in FIGS. 7 through 9, two different embodiments of slots or cutouts are alternatingly provided in the axial direction. Their cross-sections are shown in FIGS. 8 and 9.

In the cross-sectional area VIII—VIII of FIG. 7 a slot 31 is cut or milled into the securing rod 21. Its width is selected such that a substrate 3 can glide through it. Its cross-sectional surface corresponds to a circular segment 32 as represented in FIG. 8. In the rotational position of the securing rod 21 shown in FIGS. 7 and 8, the edge portions of the substrates 3 rest on the slot bottoms of the portions 33 facing the interior of the hood 20 and are secured in their position by the securing rod 21.

Upon rotation of the securing rod 21 in a counter-clockwise direction, the slots 31 are brought into a position in which the slot bottoms 34, respectively, the portions 33 of the slot bottoms 34, no longer secure the substrates 3 so that they can glide downwardly through the slots 31 or substrates 3 can be introduced into the transport device from below in an upward direction through the slots 31 into a position above the securing rod 21. After loading of the transport device 20 with substrates 3, the securing rod 21 is rotated by approximately 90° in a clockwise direction into the position shown in FIG. 7 so that the inserted substrates 3 are secured in the transport device.

According to an especially advantageous embodiment of the invention between the slots 31, disclosed in conjunction with FIG. 8, slots 35 are provided with shapes which will be explained in the following with the aid of FIGS. 7 and 9. FIG. 9 shows a cross-sectional representation along the section line IX—IX of FIG. 7.

The slot 35 in the cross-sectional area IX—IX has a slot segment 36 that corresponds to the circular or slot segment 32 of the slot 31 in the cross-sectional area VIII—VIII. Furthermore, the slot 35 has a further slot segment 37 that, with respect to the slot segment 36, is rotated by 90°. In the cross-section represented in FIG. 9 the substrates 3 which are positioned in the slots 35 are not secured and can be removed from the transport device 20, respectively, can be introduced into the transport device 20. This means that the substrates 3 which are positioned in the slots 31 are secured by the securing rod 21 and the substrates 3 which are positioned in the slots 35 are released.

Upon rotation of the securing rod 21 from the position represented in FIGS. 8 and 9 by 90° in a counter-clockwise direction, the slots 31 as well as the slots 35 are in a position in which all substrates 3 are released.

Upon rotation of the securing rod 21 from the position shown in FIGS. 8 and 9 by 90° in the clockwise direction, the substrates which are positioned in the cross-sectional area IX—IX above the securing rod 21 are held by the slot bottom 38, respectively, by the portion 39 of the slot bottom 38 of the slots 35 so that the substrates are secured in the cross-sectional areas VIII—VIII as well as within the cross-sectional area IX—IX by the securing rod 21.

The function of the inventive device with the securing rod 21 represented in FIGS. 7 through 9 is as follows:

In a rotational position of the securing rod 21 which, relative to the rotational position represented in FIGS. 7 through 9, is rotated by 90° in a counter-clockwise direction, a substrate package with substrate spacing that corresponds to the spacings of the slots 31 is inserted through the slots 31 on the securing rod 21. Subsequently, the securing rod 21 is rotated by 90° in a clockwise direction. In this position a second substrate package, wherein the substrates 3 have the same spacing as the substrates of the first substrate package but are staggered by half a substrate spacing, is inserted into the slots 35. This is possible because the segment 37 of the slot 35 in this position of the securing rod 21 allows passage of the substrates.

After the second substrate package, having a spacing that is staggered relative to the first substrate package by half a substrate spacing, has been introduced into the transport device through the segments 37 of the slots 35 on the securing rod 21, a non-represented substrate lifting device which, for example, is embodied as a knife-shaped stay and is substantially disclosed in German patent application 44 13 077 owned by the instant applicant, is lifted somewhat higher so that the substrates 3 of the first substrate package already in the slot 31 are slightly lifted and come free of the securing rod 21. Only thereafter, the securing rod 21 is again rotated by 90° in the clockwise direction so that the substrates 3 of the first as well as of the second substrate packages are secured by the securing rod 21. Since the substrates of both packages during rotation of the securing rod 21 no longer rest thereat, wear at the substrates or at the securing rod 21 during rotation is prevented.

With the embodiment of the securing rod 21 according to FIGS. 7 through 9 it is possible to condense in a simple manner substrate packages and, for example, to combine substrate packages with regular spacing to substrate packages with half spacing in a reliable manner without running the risk of breakage of the substrates. Thus, two substrate packages with regular spacing can be treated simultaneously in the fluid container so that considerable production output increase results and large amounts of treatment fluid can be saved.

The unloading of the transporting device can be performed in a single step or stepwise with formation of two separate substrate packages with double spacing of the substrates 3 to one another. When all substrates 3 positioned in the slots 31 as well as in the slots 35 are to be removed simultaneously from the transport device, the securing rod 21 is rotated into a rotational position as results from rotation of the securing rod 21 from the position shown in FIGS. 7 through 9 by 90° in the counter-clockwise direction. When it is desired to remove the two substrate packages separate from one another, the securing rod 21 is first rotated into the position represented in FIGS. 7 through 9, and only subsequently is rotated by 90° in the counter-clockwise direction so that the substrates 3 positioned in the slots 31 can also be unloaded.

In FIG. 10 a schematic representation of an embodiment of the inventive device in a plan view is shown in which, adjacent to the fluid container 1 with guide slots 2 in the sidewalls and a holding device, for example, a substrate knife 4, a loading and unloading station 40 is provided which has a substrate support holder 41 which is displaceable like a drawer in the direction of double arrow 43 and moves a substrate support 42 under a transporting device disclosed in connections with FIGS. 1 through 9, for example, a transporting hood 5, 20. The substrate support holder 41 has preferably two displacement positions for the position of the transport carrier below the transporting device which differ from one another by half a distance in which the substrates are spaced within the substrate support 42. Thus it is possible in a simple manner to move two substrate packages with regular substrate spacing, staggered by half a spacing to one another, below the transport device in order to thus perform a condensing of the substrate packages in the transport device with half the substrate spacing, as has been explained in connection with FIGS. 7 through 9 in detail.

In FIG. 10 a substrate lifting device, a so-called pusher, is shown and identified with reference numeral 44 for pushing the substrates present in the loading and/or unloading station 40 into the transport device not represented in FIG. 10.

After loading of the transport device, respectively, of the hood 5, it is brought in the direction of arrow 45 above the fluid container 1 and optionally lowered thereon for sealing the container. Subsequently, the holding device 4, for example, a substrate knife, is moved upwardly from the fluid container 1 and positioned below the substrates 3 secured within the transport device which then takes over the substrates when the securing rod 7, respectively, 21 releases the substrates.

The invention has been described with the aid of preferred embodiments. However, a person skilled in the art is aware of numerous variations and further embodiments without deviating from the inventive concept. For example, the inventive device is also usable without the hood and without use of a fluid container, for example, only for the transport and/or for the condensing of substrates, respectively, substrate packages. Even though the invention has been explained in detail with embodiments for condensing of two substrate packages to a single substrate package, the inventive transport device can also be used for condensing more than two packages to one single package. For this purpose, the securing rod 7, respectively, 21 can be embodied with corresponding areas of slots and slot shape repetitions in the axial direction, and the loading and unloading station 40 can have a plurality of displacement positions which, in the direction of the substrate package axis, are displaced relative to one another by, for example, a third or a fourth of the substrate spacing of the substrate packages to be condensed.

The present invention is, of course, in no way restricted to the specific disclosure of the specification and drawings, but also encompasses any modifications within the scope of the appended claims.

What we claim is:

1. A device for treatment of substrates in a fluid container, said device comprising:
    a container containing a treatment fluid;
    a substrate transport device moveable into a position above said container;
    said substrate transport device comprising at least two opposed walls with slots for receiving the substrates and at least one substrate holding device for securing the substrates in a first position and releasing the substrates in a second position;
    said substrate holding device comprising at least one rotatable securing rod.

2. A device according to claim 1, wherein said at least one securing rod is rotatable from said first position into said second position.

3. A device according to claim 1, wherein said at least one securing rod is arranged within one of said two opposed walls.

4. A device according to claim 3, wherein said at least one securing rod comprises at least one projection that in said first position projects into an interior of said substrate transport device.

5. A device according to claim 4, wherein said at least one securing rod in said second position is flush with an inner surface of said one of said opposed walls.

6. A device according to claim 4, wherein said at least one securing rod comprises at least two different projections.

7. A device according to claim 6, wherein said at least one securing rod has a rectangular cross-section or a polygonal cross-section.

8. A device according to claim 7, wherein said at least one securing rod, in a longitudinal area on which the substrates rest in said first position, has slots for receiving the substrates.

9. A device according to claim 8, wherein said slots are positioned in said at least one projection an have different spacings.

10. A device according to claim 9, wherein a spacing between said slots matches a spacing between substrates combined for transport in a substrate package.

11. A device according to claim 9, wherein a spacing between said slots is half a spacing between substrates combined for transport in a substrate package.

12. A device according to claim 3, wherein said at least one securing rod has a third position in which a first set of the substrates is secured and a second set of the substrates is released.

13. A device according to claim 12, wherein every other one of the substrates is secured and the substrates interposed therebetween are released.

14. A device according to claim 12, wherein said at least one securing rod seals said one of said two opposed walls to an exterior of said substrate transport device in at least one of said first, second, and third positions.

15. A device according to claim 1, wherein the substrates are combined in a substrate package and wherein said at least one securing rod has a length matching a length of the substrate package.

16. A device according to claim 1, wherein said substrate transport device is a hood.

17. A device according to claim 16, wherein said at least two opposed walls are sidewalls of said hood.

18. A device according to claim 16, wherein said hood is a processing hood.

19. A device according to claim 18, wherein said substrate transport device comprises inlet openings for at least one fluid.

20. A device according to claim 18, wherein said substrate transport device is designed for a drying process according to a Marangoni method.

21. A device according to claim 1, wherein said substrate transport device comprises a closing device at a side thereof facing said container.

22. A device according to claim 1, further comprising a loading/unloading station for loading the substrates onto and unloading the substrates from said substrate transport device.

23. A device according to claim 22, further comprising a substrate support holder moveable into a position under said substrate transport device.

24. A device according to claim 23, wherein the substrates are combined for transport to substrate packages having an axis perpendicular to a face of the substrates and wherein said substrate support holder has at least two displacement positions which are staggered relative to one another in a direction of said axis of the substrate package by half a spacing between the substrates.

25. A device according to claim 22, wherein said loading/unloading station comprises a substrate lifting device for lifting the substrates and lowering the substrates out of and into said substrate transport device.

26. A device according to claim 25, wherein said substrate lifting device has at least one stay matching a length of the substrate package in a direction of said axis.

27. A device according to claim 25, wherein said substrate lifting device has support surfaces having slots or notches spaced relative to one another by half a spacing of the substrates in the substrate package.

28. A device according to claim 25, wherein said substrate lifting device has support edges having slots or notches spaced relative to one another by half a spacing of the substrates in the substrate package.

29. A method for transporting substrates by a substrate transport device moveable into a position above a container for treatment of the substrates, wherein the substrate transport device comprises at least one rotatable securing rod for securing the substrates in a first position and releasing the substrates in a second position; said method comprising the steps of:
    a) rotating the securing rod into the second position;
    b) inserting the substrates into the substrate transport device until at least the widest portion of the substrates is positioned above the securing rod;
    c) rotating the securing rod into the first position.

30. A method for transporting substrates by a substrate transport device moveable into a position above a container for treatment of the substrates, wherein the substrate transport device comprises at least one rotatable securing rod for securing the substrates in a first position, releasing the substrates in a second position, and securing a first set of the substrates and releasing a second set of the substrates in a third position; said method comprising the steps of:

a) rotating the securing rod into the second position;

b) inserting a first set of substrates into the substrate transport device until at least the widest portion of the substrates is positioned above the securing rod;

c) rotating the securing rod into the third position in which the first set of substrates is secured;

d) inserting a second set of substrates into the substrate transport device spaced relative to the first set with a spacing of half a spacing between the substrates of the first set;

e) rotating the securing rod into the second position.

31. A method according to claim 30, further including the step of lifting the first and second sets after step d) and before step e) to such an extent that during step e) none of the substrates rests on the securing rod.

* * * * *